United States Patent
Yoshihara et al.

(10) Patent No.: US 7,542,335 B2
(45) Date of Patent: Jun. 2, 2009

(54) MAGNETIC STORAGE DEVICE USING FERROMAGNETIC TUNNEL JUNCTION ELEMENT

(75) Inventors: Hiroshi Yoshihara, Nagasaki (JP); Katsutoshi Moriyama, Saga (JP); Hironobu Mori, Nagasaki (JP); Nobumichi Okazaki, Kanagawa (JP)

(73) Assignee: Sony Corporation, Tokyo (JP)

( * ) Notice: Subject to any disclaimer, the term of this patent is extended or adjusted under 35 U.S.C. 154(b) by 291 days.

(21) Appl. No.: 10/530,271

(22) PCT Filed: Sep. 18, 2003

(86) PCT No.: PCT/JP03/11939

§ 371 (c)(1),
(2), (4) Date: Apr. 5, 2005

(87) PCT Pub. No.: WO2004/034469

PCT Pub. Date: Apr. 22, 2004

(65) Prior Publication Data

US 2005/0285093 A1    Dec. 29, 2005

(30) Foreign Application Priority Data

Oct. 8, 2002 (JP) .............................. 2002-294356

(51) Int. Cl.
*G11C 11/14* (2006.01)
(52) U.S. Cl. ............... 365/158; 257/295; 257/E43.004; 365/171; 365/173
(58) Field of Classification Search ............... 257/30, 257/295, E43.004, E27, E29.323, E21.665; 365/158, 171, 173, 209; 360/324.2, 324.1, 360/324.11, 324.12
See application file for complete search history.

(56) References Cited

U.S. PATENT DOCUMENTS 6,191,989 B1    2/2001    Luk et al.
6,771,533 B2 *  8/2004    Witcraft et al. ............. 365/158

FOREIGN PATENT DOCUMENTS

| JP | 06-209075 | 7/1994 |
| JP | 10-116489 | 5/1998 |
| JP | 10-247382 | 9/1998 |
| JP | 2002-025245 | 1/2002 |
| JP | 2002-231904 | 8/2002 |
| JP | 2003-069107 | 3/2003 |
| JP | 2003-174148 | 6/2003 |
| JP | 2003-229543 | 8/2003 |
| JP | 2004-133957 | 4/2004 |
| WO | 02/078100 A1 | 10/2002 |

* cited by examiner

*Primary Examiner*—Allan R. Wilson
(74) *Attorney, Agent, or Firm*—Sonnenschein Nath & Rosenthal LLP

(57) ABSTRACT

It is a task to provide a magnetic storage device of complementary type, of which reliability is improved by precisely performing writing storage data.

In the present invention, therefore, in a magnetic storage device of complementary type for storing storage data contrary to each other in a first ferromagnetic tunnel junction element and a second ferromagnetic tunnel junction element, respectively, the first ferromagnetic tunnel junction element and the second ferromagnetic tunnel junction element are formed adjacently on a semiconductor substrate, first writing lines is wound around the first ferromagnetic tunnel junction element like a coil and the same time second writing lines is wound around the second ferromagnetic tunnel junction element like a coil, and in addition, a winding direction of the first writing lines and a winding direction of the second writing lines are reversed to each other.

14 Claims, 5 Drawing Sheets

FIG. 5
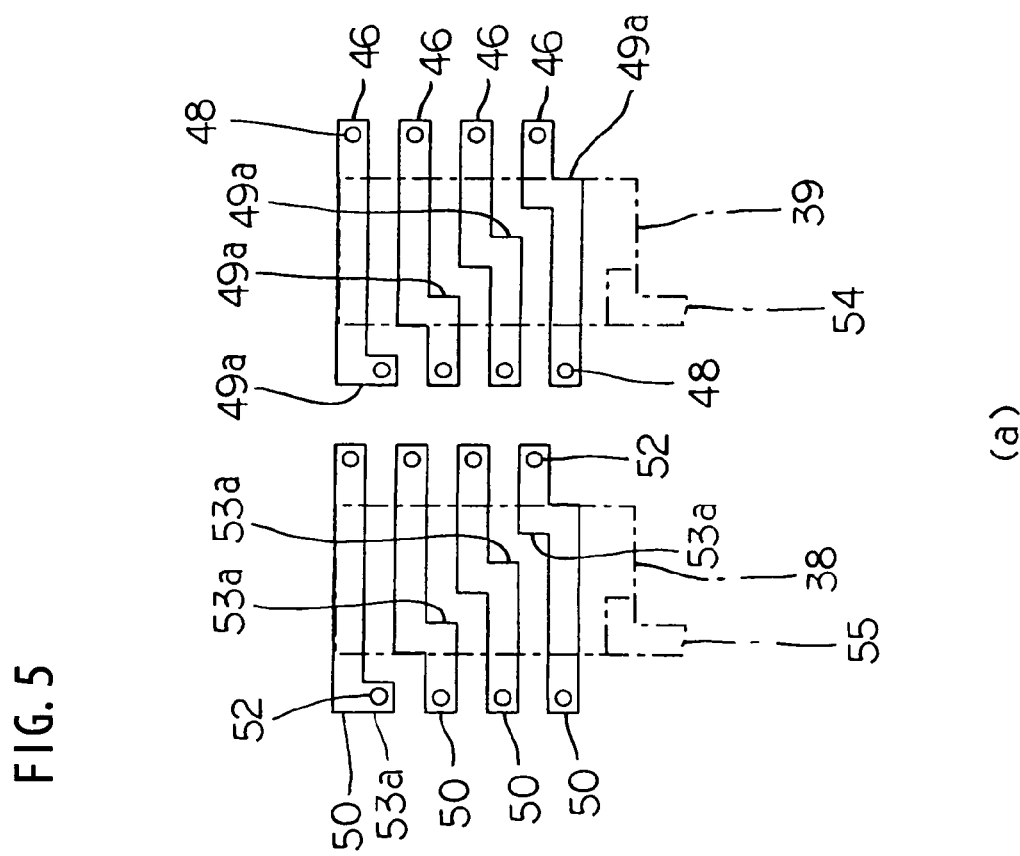
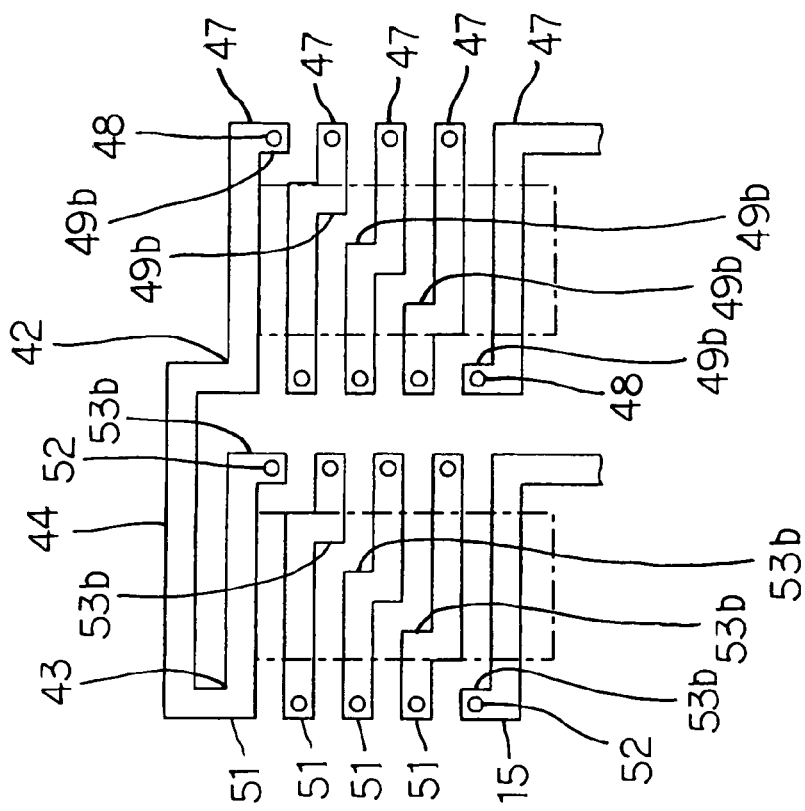

MAGNETIC STORAGE DEVICE USING FERROMAGNETIC TUNNEL JUNCTION ELEMENT

The present invention relates to a magnetic storage device using a ferromagnetic tunnel junction element.

In recent years, as a storage medium of a computer, a high-speed writable, nonvolatile one having no restriction on the number of writings has been desired, and as the storage medium having these performances, a ferromagnetic tunnel junction element formed by laminating a fixed magnetization layer and a free magnetization layer via a tunnel barrier layer has attracted attention.

The above-mentioned ferromagnetic tunnel junction element has a property that when the free magnetization layer is magnetized in the same direction (parallel direction to) as a magnetization direction of the fixed magnetization layer, a resistance value in the tunnel barrier layer becomes lower than a predetermined resistance value (this is called a low resistance state), while when the free magnetization layer is magnetized in an opposite direction (antiparallel direction) of the magnetization direction of the fixed magnetization, the resistance value in the tunnel barrier layer becomes higher than the predetermined resistance value (this is called a high resistance state).

By using the above-mentioned property that the resistance value in the tunnel barrier layer is varied according to the magnetization direction in the free magnetization layer, the ferromagnetic tunnel junction element forms the states of the two different magnetization directions depending on whether the free magnetization layer is magnetized in the same direction as the magnetization direction of the fixed magnetization layer or the free magnetization layer is magnetized in the opposite direction of the magnetization direction of the fixed magnetization layer. By making the above-mentioned states of the two different magnetization directions correspond to "0" or "1", data is stored in the ferromagnetic tunnel conjunction element.

A magnetic storage device using the above-mentioned ferromagnetic tunnel junction element as a storage device determines which data of the two kinds of data is stored in the ferromagnetic tunnel junction element to thereby read the data from the ferromagnetic tunnel junction element. For this, it is necessary to determine whether the ferromagnetic tunnel junction element is in the high resistance state or in the low resistance state.

As such a magnetic storage device which is enabled to determine whether the resistance state of the ferromagnetic tunnel junction element is the high resistance state or the low resistance state with a simple structure, there is known a magnetic storage device of complementary type in which storage data contrary to each other is stored in first and second ferromagnetic tunnel junction elements and a resistance value of the first ferromagnetic tunnel junction element and a resistance value of the second ferromagnetic tunnel junction element are compared to thereby judge whether the resistance value of the first ferromagnetic tunnel junction element is in the high resistance state or in the low resistance state.

In the above-mentioned complementary magnetic storage device, in order to store a piece of data, a pair of (two) ferromagnetic tunnel junction elements consisting of the first ferromagnetic tunnel junction element and the second ferromagnetic tunnel junction element is formed adjacently to each other on the same semiconductor substrate, and in writing, storage data is written in the first ferromagnetic tunnel junction element, and at the same time, storage data contrary to that of the first ferromagnetic tunnel junction element is stored in the second ferromagnetic tunnel junction element, and then, in reading, resistance values of these two ferromagnetic tunnel junction elements are compared. When the resistance value of the first ferromagnetic tunnel junction element is higher than that of the second ferromagnetic tunnel junction element, it is determined that the first ferromagnetic tunnel junction element is in the high resistance state, while when the resistance value of the first ferromagnetic tunnel junction element is lower than that of the second ferromagnetic tunnel junction element, it is determined that the first ferromagnetic tunnel junction element is in the low resistance state (for example, refer to the specification of U.S. Pat. No. 6,191,989).

However, in the above-mentioned conventional complementary magnetic storage device, in order to store a piece of data, the storage data contrary to each other is stored in the first ferromagnetic tunnel junction element and the second ferromagnetic tunnel junction element, so that the storage in the two ferromagnetic tunnel junction elements needs to be performed for storing a piece of storage data and a writing current for changing the magnetization direction of the first and second ferromagnetic tunnel junction elements is doubled, which may disadvantageously increase power consumption of the magnetic storage device.

On the other hand, in the magnetic storage device using the ferromagnetic tunnel junction element, there is known one having a structure in which writing lines is wound around the ferromagnetic tunnel junction element like a coil in order to reduce the power consumption in writing (for example, refer to the specification of U.S. Pat. No. 5,732,016).

In the above-mentioned magnetic storage device, since the writing lines is formed in to a coil shape, a writing magnetic force can be generated efficiently with a smaller writing current, thereby reducing the power consumption in writing.

Therefore, it can be considered to emply a structure in which a technique of forming the above-mentioned conventional writing lines into a coil shape is applied to the complementary magnetic storage device. That is, it can be considered that the first and second ferromagnetic tunnel junction elements are formed adjacently to each other, and first coil-like writing lines is disposed around the first ferromagnetic tunnel junction element and second coil-like writing lines is disposed around the second ferromagnetic tunnel junction element to compose the complementary magnetic storage device.

However, when the first and second coil-like writing lines is formed around the first and second ferromagnetic tunnel junction elements, if a winding direction of the first writing lines and a winding direction of the second writing lines are the same, a direction of a writing magnetic force generated by energizing the first writing lines and a direction of a writing magnetic force generated by energizing the second writing lines are also the same.

In this case, the direction of the magnetic force formed outside the first writing wire and the direction of the magnetic force formed outside the second writing lines are the same, so that the outside magnetic forces interfere with each other and the magnitude and the direction of the writing magnetic forces are varied, which may hinder the storage data from precisely being written in the first and second ferromagnetic tunnel junction elements.

Furthermore, in order to solve the above-mentioned defect, a magnetic shield can be formed between the first ferromagnetic tunnel junction element and the second ferromagnetic tunnel junction element to prevent the outside magnetic forces from interfering with each other. However, in this case, space for forming the magnetic shield between the first ferromagnetic tunnel junction element and the second ferromagnetic tunnel junction element is required, which may enlarge the magnetic storage device.

SUMMARY OF THE INVENTION

Consequently, according to the present invention relating to Claim 1, in a magnetic storage device of complementary type for storing storage data contrary to each other in a first ferromagnetic tunnel junction element and a second ferromagnetic tunnel junction element, respectively, the first ferromagnetic tunnel junction element and the second ferromagnetic tunnel junction element are formed adjacently on a semiconductor substrate; and first writing lines is wound around the first ferromagnetic tunnel junction element like a coil and the same time second writing lines is wound around the second ferromagnetic tunnel junction element like a coil, and in addition, a winding direction of the first writing lines and a winding direction of the second writing lines are reversed each other.

Furthermore, according to the present invention relating to Claim 2, in the present invention relating to Claim 1, a start-end portion of the second writing lines is connected to a terminal-end portion of the first writing lines to be a sequence of writing lines.

Furthermore, according to the present invention relating to Claim 3, in the present invention of Claim 1 or Claim 2, the first writing lines and the second writing lines have parallel wiring portions formed, the parallel wiring portions extending in a direction substantially parallel to a magnetization direction of fixed magnetization layers at positions immediately above or immediately below the first ferromagnetic tunnel junction element and the second ferromagnetic tunnel junction element.

Furthermore, according to the present invention relating to Claim 4, in the present invention relating to Claim 1 or Claim 2, the first writing lines and the second writing lines have upper and lower writing lines extending in a substantially perpendicular to the magnetization direction of the fixed magnetization layers of the first ferromagnetic tunnel junction element and the second ferromagnetic tunnel junction element, above and below the first ferromagnetic tunnel junction element and the second ferromagnetic tunnel junction element, and in addition, in at least one of the upper and lower writing lines, there are provided parallel wiring portions extending in a direction substantially parallel to a magnetization direction of the fixed magnetization layers at positions immediately above or immediately below the first ferromagnetic tunnel junction element and the second ferromagnetic tunnel junction element.

BRIEF DESCRIPTION OF DRAWINGS

FIG. 5 is a plan view of the same.

DETAILED DESCRIPTION OF THE PRESENTLY PREFERRED EMBODIMENTS

Figure 1:
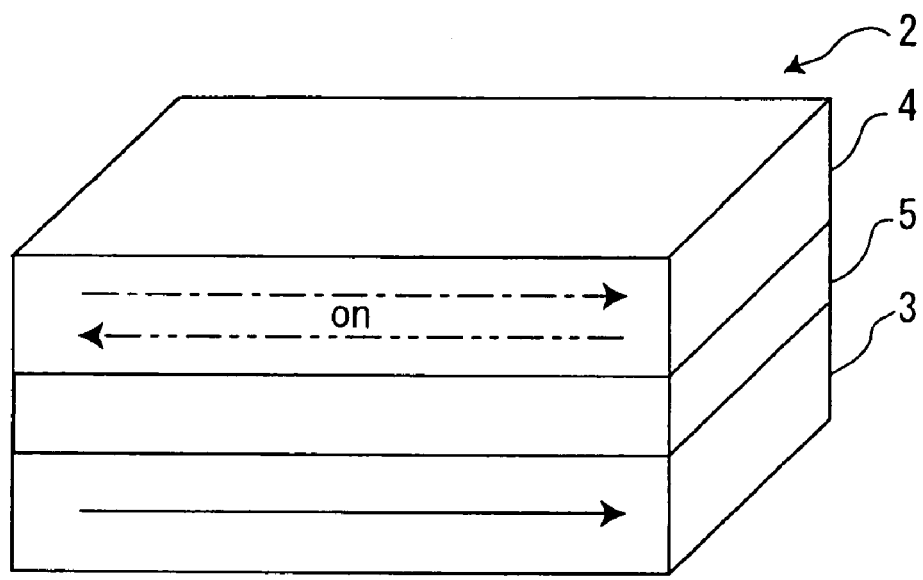
FIG. 1 is an explanatory view showing a ferromagnetic tunnel junction element.

A magnetic storage device using a ferromagnetic tunnel junction element according to the present invention is a magnetic storage device of complementary type in which on the same semiconductor substrate, a first ferromagnetic tunnel junction element and a second ferromagnetic tunnel junction element are formed adjacently to, and apart from each other, in a direction perpendicular to a magnetization direction of fixed magnetization layers of the same ferromagnetic tunnel junction elements and storage data contrary to each other (for example, "0" and "1") is stored in these first ferromagnetic tunnel junction element and second ferromagnetic tunnel junction element, respectively.

In addition, in the present invention, first writing lines is wound around the first ferromagnetic tunnel junction element like a coil, and the same time, second writing lines is wound around the second ferromagnetic tunnel junction element like a coil.

Thus, in the present invention, by forming the first and second writing lines around the first and second ferromagnetic tunnel junction elements like a coil, writing magnetic forces can be generated efficiently with a smaller writing current, thereby reducing power consumption in writing even when the magnetic storage device is structured to be of a complementary type.

Furthermore, in the present invention, a winding direction of the first writing lines and a winding direction of the second writing lines are reversed to each other.

Thus, when the winding directions of the adjacent first writing lines and second writing lines are reversed to each other, magnetic fields generated when the storage data contrary to each other is written in the first and second ferromagnetic tunnel junction elements become closed loops and thus a magnetic force for magnetizing a free magnetization layer of the first ferromagnetic tunnel junction element and a magnetic force for magnetizing a free magnetization layer of the second ferromagnetic tunnel junction element do not interfere with each other, so that the storage data can be written precisely in the first and second ferromagnetic tunnel junction elements and the reliability of the magnetic storage device can be improved.

In particular, in the case where a start-end portion of the second writing lines is connected to a terminal-end portion of the first writing lines to form a sequence of writing lines, an occupying area of the writing lines can be reduced as much as possible, so that the miniaturization of the magnetic storage device can be achieved.

Furthermore, in the case where a structure of the first writing lines the second writing lines is such that there are provided upper and smaller writing lines extending in the direction substantially perpendicular to the magnetization direction of the fixed magnetization layers of the first ferromagnetic tunnel junction element and the second ferromagnetic tunnel junction element, above and below the first ferromagnetic tunnel junction element and the second ferromagnetic tunnel junction element, and in addition, in at least one of the upper and lower writing lines, there are provided parallel wiring portions extending in a direction substantially parallel to the magnetization direction of the fixed magnetization layers at positions immediately above or immediately below the first ferromagnetic tunnel junction element and the second ferromagnetic tunnel junction element, by an action of the magnetic forces generated by the writing current flowing through the parallel wiring portions extending in the direction substantially parallel to the magnetization direction of the fixed magnetization layers, the direction of the writing magnetization forces acting on the free magnetization layers leans toward the magnetization direction of the fixed magnetization layers, which can produce an assist effect. Accordingly, the magnetization direction of the free magnetization layers can be changed smoothly with a smaller writing current and lower power consumption of the magnetic storage device can be achieved.

In particular, by forming the parallel wiring portions at the positions immediately above and below the first ferromagnetic tunnel junction element and the second ferromagnetic tunnel junction element, a distance between the parallel wiring portions and the ferromagnetic tunnel junction elements can be made as short as possible, which can increase the assist effect.

In the following, specific embodiments of the present invention are described with reference to the drawings.

Prior to the description of a magnetic storage device 1 according to the present invention, a structure of a ferromagnetic tunnel junction element 2 is described. As shown in FIG. 1, the ferromagnetic tunnel junction element 2 is formed by laminating a thin-film fixed magnetization layer 3 and a thin-film free magnetization layer 4 via a tunnel barrier layer 5.

Here, the fixed magnetization layer 3 is made of a ferromagnetic body (for example, CoFe) and is always magnetized in a constant direction. Furthermore, the free magnetization layer 4 is made of a ferromagnetic body (for example, NiFe) and is magnetized in the same direction (parallel direction) as, or opposite direction (antiparallel direction) to, the magnetization direction of the fixed magnetization layer 3. Furthermore, the tunnel barrier layer 5 is made of an insulating body (for example, A1203).

The above-mentioned ferromagnetic tunnel junction element 2 has a property that when the free magnetization layer 4 is magnetized in the same direction as the magnetization direction of the fixed magnetization layer 3 (a case indicated by a dot-dashed line in FIG. 1), a resistance value in the tunnel barrier layer 5 is lower than a predetermined resistance value, while when the free magnetization layer 4 is magnetized in the opposite direction of the magnetization direction of the fixed magnetization layer 3 (a case indicated by a two dot-dashed line in FIG. 1), the resistance value in the tunnel barrier layer 5 is higher than the predetermined resistance value. Therefore, states of the two different magnetization directions are formed depending on whether the free magnetization layer 4 is magnetized in the same direction as the magnetization direction of the fixed magnetization layer 3 or the free magnetization layer 4 is magnetized in the opposite direction of the magnetization direction of the fixed magnetization layer 3, and by making the above-mentioned states of the two different magnetization directions correspond to data of "0" or "1", the data is stored in the ferromagnetic tunnel junction element 2.

Subsequently, a structure of the magnetic storage device 1 according to the present invention is described.

First Embodiment

Figure 2:
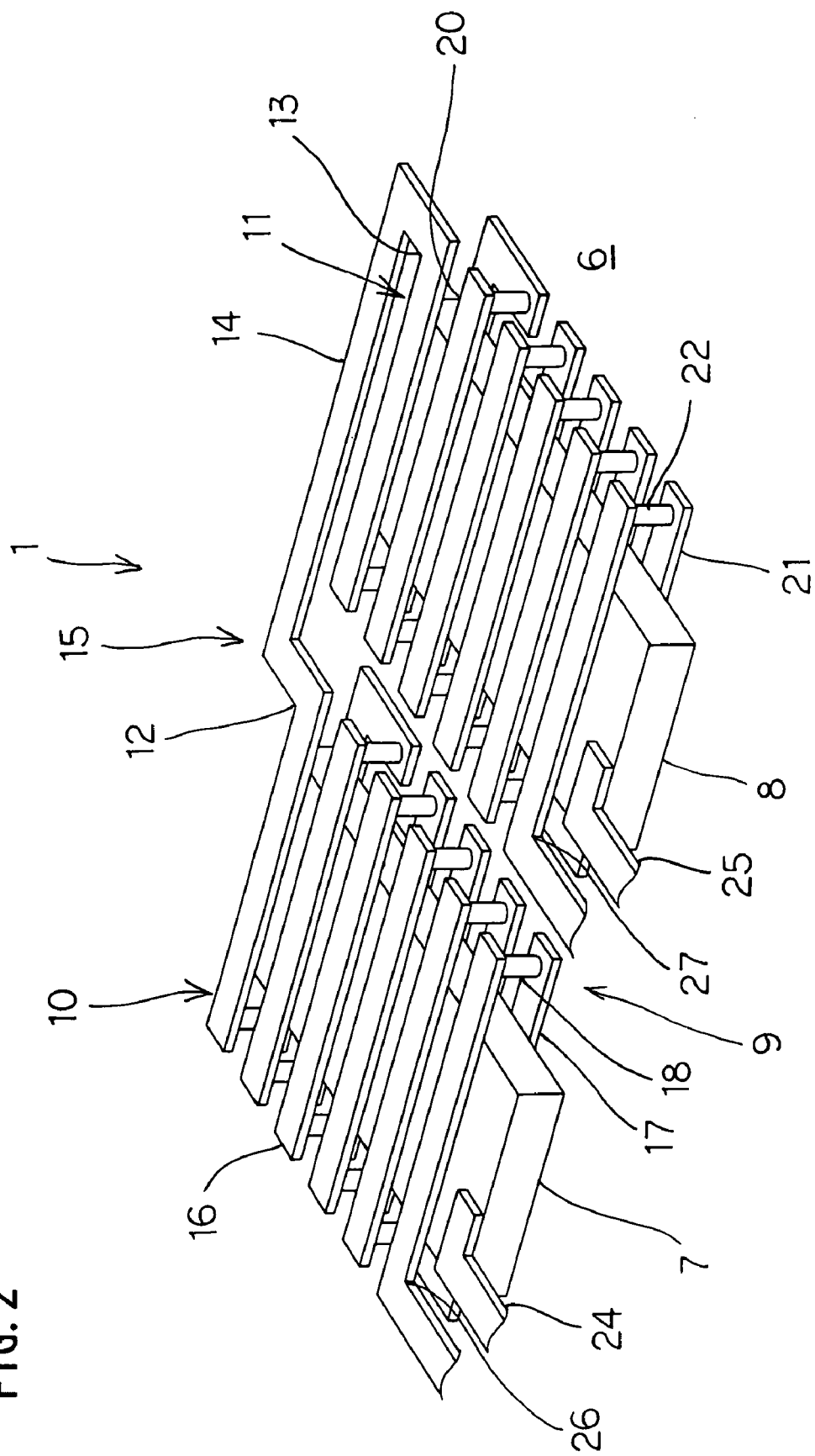
FIG. 2 is a perspective view showing a magnetic storage device according to a first embodiment.
Figure 3:
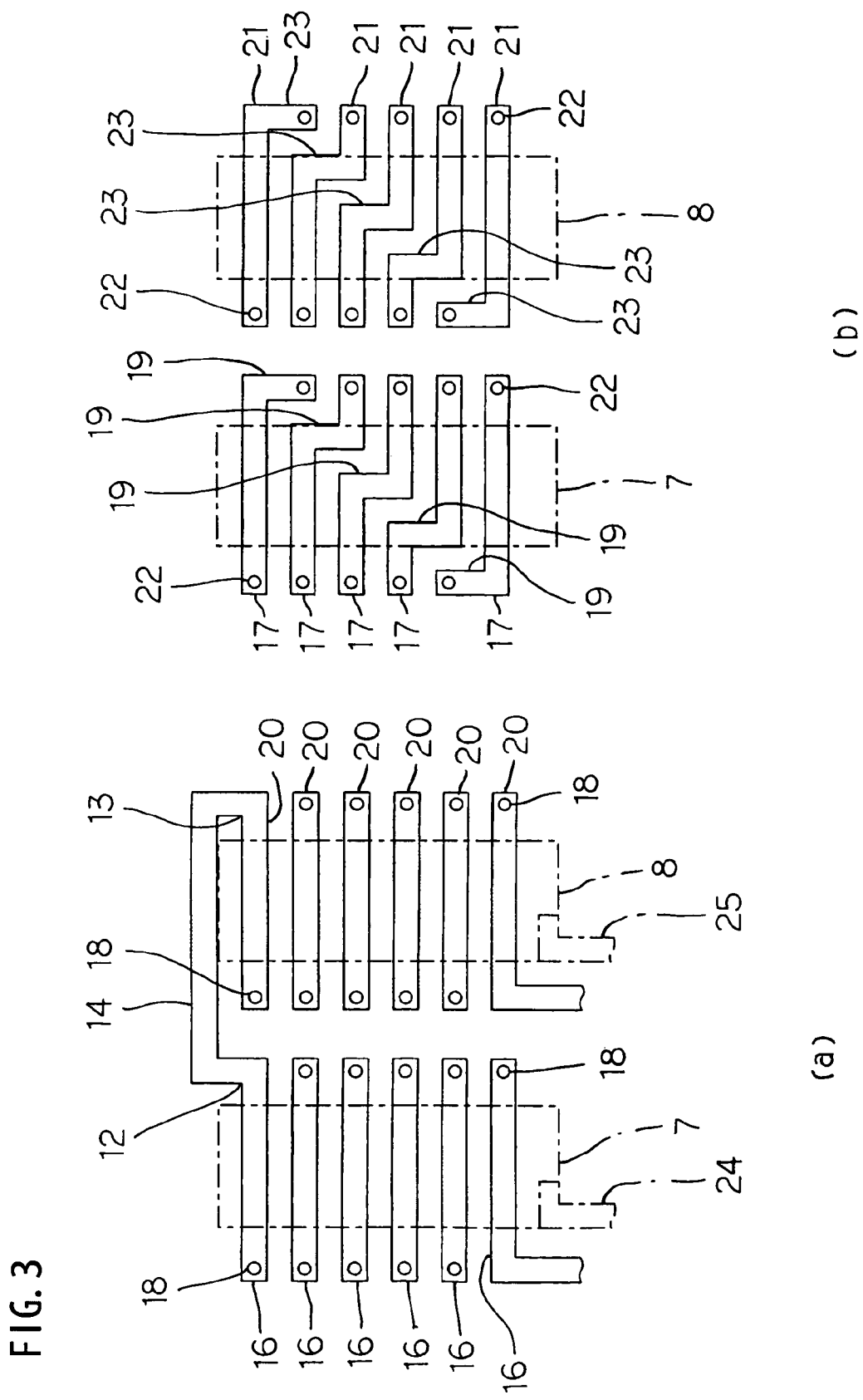
FIG. 3 is a plan view of the same.

FIGS. 2 and 3 are views showing the magnetic storage device 1 according to a first embodiment of the present invention.

The magnetic storage device 1 is a complementary storage device in which on a surface of the same semiconductor substrate 6, a first ferromagnetic tunnel junction element 7 and a second ferromagnetic tunnel junction element 8 are formed adjacently to, and apart from each other in a direction perpendicular to a magnetization direction (anteroposterior direction in FIGS. 2 and 3) of the fixed magnetization layers 3 (refer to FIG. 1) of the first and second ferromagnetic tunnel junction elements 7, 8, and storage data contrary to each other (for example, "0" and "1") is stored in these first ferromagnetic tunnel junction element 7 and second ferromagnetic tunnel junction element 8, respectively.

Here, in the magnetic storage device 1, the first ferromagnetic tunnel junction element 7 and the second ferromagnetic tunnel junction element 8 compose a storage element 9 of one bit. In practice, in the magnetic storage device 1, on the same semiconductor substrate 6, the storage elements 9 of a plurality of bits are formed apart from each other in lateral and vertical directions. However, in order to facilitate understanding, the storage element 9 of one bit is focused on for description.

The storage element 9, as shown in FIG. 2, a first coil-like writing lines 10 is formed around the first ferromagnetic tunnel junction element 7 and at the same time a second coil-like writing lines 11 is formed around the second ferromagnetic tunnel junction element 8, and in addition a start-end portion 13 of the second writing lines 11 is connected to an end portion 12 of the first writing lines 10 via a joining portion 14 to form a sequence of writing lines 15, and further, a winding direction of the first writing wire 10 (clockwise in FIG. 2) and a winding direction of the second writing lines 11 (counterclockwise in FIG. 2) are reversed to each other.

A structure of the writing lines 15 is now described in detail. The first writing lines 10, as shown in FIGS. 2 and 3, is structured in such a manner that six pieces of upper writing lines 16 extending in the direction substantially perpendicular to the magnetization direction (downward direction in FIG. 3) of the fixed magnetization layer 3 of the first ferromagnetic tunnel junction element 7, above the first ferromagnetic tunnel junction element 7, and six pieces of lower writing lines 17 extending in the direction substantially perpendicular to the magnetization direction (downward direction in FIG. 3) of the fixed magnetization layer 3 of the first ferromagnetic tunnel junction element 7, below the first ferromagnetic tunnel junction element 7 are connected at right and left end edge portions of the upper writing lines 16 and the lower writing lines 17 via through-holes 18 to be wound around the first ferromagnetic tunnel junction element 7 clockwise like a coil, as shown in FIG. 2.

In addition, at end portions or midway portions of the lower writing lines 17 at positions immediately below the first ferromagnetic tunnel junction element 7, the first writing lines 10 has parallel wiring portions 19 formed, which extend in the direction substantially parallel to the magnetization direction of the fixed magnetization layer 3.

The second writing lines 11, as shown in FIGS. 2 and 3, is structured in such a manner that six pieces of upper writing lines 20 extending in the direction substantially perpendicular to the magnetization direction (downward direction in FIG. 3) of the fixed magnetization layer 3 of the second ferromagnetic tunnel junction element 8, above the second ferromagnetic tunnel junction element 8 and six pieces of lower writing lines 21 extending in the direction substantially perpendicular to the magnetization direction (downward direction in FIG. 3) of the fixed magnetization layer 3 of the second ferromagnetic tunnel junction element 8, below the second ferromagnetic tunnel junction element 8 are connected at right and left end edge portions of the upper writing lines 20 and the lower writing lines 21 via through-holes 22 to be wound around the second ferromagnetic tunnel junction element 8 counterclockwise like a coil, as shown in FIG. 2.

In addition, at end portions or midway portions of the lower writing lines 21 at positions immediately below the second ferromagnetic tunnel junction element 8, the second writing lines 11 has parallel wiring portions 23 formed, which extend in the direction substantially parallel to the magnetization direction of the fixed magnetization layer 3.

A right end portion of the upper writing lines 16 that is the terminal-end portion 12 of the first writing lines 10 is connected to a right end portion of the upper writing lines 20 that is the start-end portion 13 of the second writing lines 11 via the joining portion 14. In the figures, reference numerals 24, 25 are reading wiring connected to the free magnetization layers 4 of the first and second ferromagnetic tunnel junction elements 7, 8.

The magnetic storage device 1 is structured as described above. By energizing the writing lines 15, magnetic forces in directions opposite to each other are generated in the first and second coil-like writing lines 10, 11 and these magnetic forces act on the free magnetization layers 4 of the first and second ferromagnetic tunnel junction elements 7, 8 to magnetize the free magnetization layer 4 of the first ferromagnetic tunnel junction element 7 and the free magnetization layer 4 of the second ferromagnetic tunnel junction element 8 in directions opposite to each other, and thereby data contrary to each other can be stored in the first ferromagnetic tunnel junction element 7 and the second ferromagnetic tunnel junction element 8, respectively.

More specifically, when the writing lines 15 is energized from a start-end portion 26 toward a terminal-end portion 27, in the first writing lines 10, the energizing is performed from the start-end portion 26 toward the terminal-end portion 12, thereby generating a magnetic force from the front to the rear (that is, magnetic force in a direction opposite to the magnetization direction of the fixed magnetization layer 3 of the first ferromagnetic tunnel junction element 7) with respect to the free magnetization layer 4 of the first ferromagnetic tunnel junction element 7, so that the free magnetization layer 4 of the first ferromagnetic tunnel junction element 7 can be magnetized in the direction opposite to the magnetization direction of the fixed magnetization layer 3. On the other hand, in the second writing lines 11, the energizing is performed from the start-end portion 13 toward the terminal-end portion 27, thereby generating a magnetic force from the rear to the front (that is, magnetic force in the same direction as the magnetization direction of the fixed magnetization layer 3 of the second ferromagnetic tunnel junction element 8) with respect to the free magnetization layer 4 of the second ferromagnetic tunnel junction element 8, so that the free magnetization layer 4 of the first ferromagnetic tunnel junction element 7 can be magnetized in the same direction as the magnetization direction of the fixed magnetization layer 3.

On the contrary, when the writing lines 15 is energized from the terminal-end portion 27 toward the start-end portion 26, in the first writing lines 10, the energizing is performed from the terminal-end portion 12 toward the start-end portion 26, thereby generating a magnetic force from the rear to the front (that is, magnetic force in the same direction as the magnetization direction of the fixed magnetization layer 3 of the first ferromagnetic tunnel junction element 7) with respect to the free magnetization layer 4 of the first ferromagnetic tunnel junction element 7, so that the free magnetization layer 4 of the first ferromagnetic tunnel junction element 7 can be magnetized in the same direction as the magnetization direction of the fixed magnetization layer 3. On the other hand, in the second writing lines 11, the energizing is performed from the terminal-end portion 27 toward the start-end portion 13, thereby generating a magnetic force from the front to the rear (that is, magnetic force in the direction opposite to the magnetization direction of the fixed magnetization layer 3 of the second ferromagnetic tunnel junction element 8) with respect to the free magnetization layer 4 of the second ferromagnetic tunnel junction element 8, so that the free magnetization layer 4 of the first ferromagnetic tunnel junction element 7 can be magnetized in the direction opposite to the magnetization direction of the fixed magnetization layer 3.

As described above, in the present embodiment, since the first and second writing lines 10,11 are formed like a coil, the writing magnetic forces can be efficiently generated with a smaller writing current, thereby reducing the power consumption in writing.

In addition, in the present embodiment, since the winding direction of the first writing lines 10 and the winding direction of the second writing lines 11 are reversed to each other, when the storage data contrary to each other is written in the first and second ferromagnetic tunnel junction elements 7,8, the magnetic force acting on the first ferromagnetic tunnel junction element 7 and the magnetic force acting on the second ferromagnetic tunnel junction element 8 are opposite to each other and form magnetic fields into closed loops, so that the interference between the magnetic force for magnetizing the free magnetization layer 4 of the first ferromagnetic tunnel junction element 7 and the magnetic force for magnetizing the free magnetization layer 4 of the second ferromagnetic tunnel junction element 8 does not occur. This enables the storage data to be precisely written in the first and second ferromagnetic tunnel junction elements 7, 8 and thus the reliability of the magnetic storage device 1 can be improved.

Furthermore, when the storage data is written in the predetermined storage element 9, the writing magnetic forces form closed loops, so that the writing magnetic forces in the predetermined storage element 9 do not affect another storage element 9 in the vicinity and thus do not change a storage state of the another storage element 9, which can also improve the reliability of the magnetic storage device 1.

Furthermore, in the present embodiment, since the start-end portion 13 of the second writing lines 11 is connected to the terminal-end portion 12 of the first writing lines 10 to form a sequence of writing lines 15, only by energizing the writing lines 15 from the start-end portion 26 toward the terminal-end portion 27 thereof, or by energizing the writing lines 15 from the terminal-end portion 27 toward the start-end portion 26, the storage data contrary to each other can be stored in the first and second ferromagnetic tunnel junction elements 7, 8. Therefore, the structure of the writing lines 11 can be simple and easy to manufacture and a reduction in manufacturing cost of the magnetic storage device 1 can be achieved, and the same time an occupying area of the writing lines 15 in the semiconductor substrate 6 can be reduced as much as possible, so that the miniaturization of the magnetic storage device 1 can be achieved.

Furthermore, in the present embodiment, since the lower writing lines 17, 21 of the first writing lines 10 and the second writing lines 11 are provided with the parallel wiring portions 19, 23 extending in the direction substantially parallel to the magnetization of the fixed magnetization layers 3 at the positions immediately below the first ferromagnetic tunnel junction element 7 and the second ferromagnetic tunnel junction element 8, the action of the magnetic forces generated by the writing current flowing through the parallel wiring portions 19, 23 extending in the direction substantially parallel to the magnetization direction of the fixed magnetization layers 3 produces an assist effect by lean of the direction of the writing magnetic forces acting on the free magnetization layers 4 toward the magnetization direction of the fixed magnetization layers 3 and thus the magnetization direction of the free magnetization layers 4 can be smoothly changed even with a smaller writing current, so that lower power consumption of magnetic storage device 1 can be achieved.

Second Embodiment

Although in the above-mentioned first embodiment, only the lower writing lines 17, 21 are provided with the parallel wiring portions 19, 23 in the direction substantially parallel to the magnetization direction of the fixed magnetization layers 3, the present invention is not limited to this structure, but the parallel wiring portions only needs to be formed in at least any one of the upper writing lines and the lower writing lines of the first writing lines or the second writing lines, and the parallel wiring portions may be formed in the upper writing lines and the lower writing lines of the first writing lines and the second writing lines.

Figure 4:
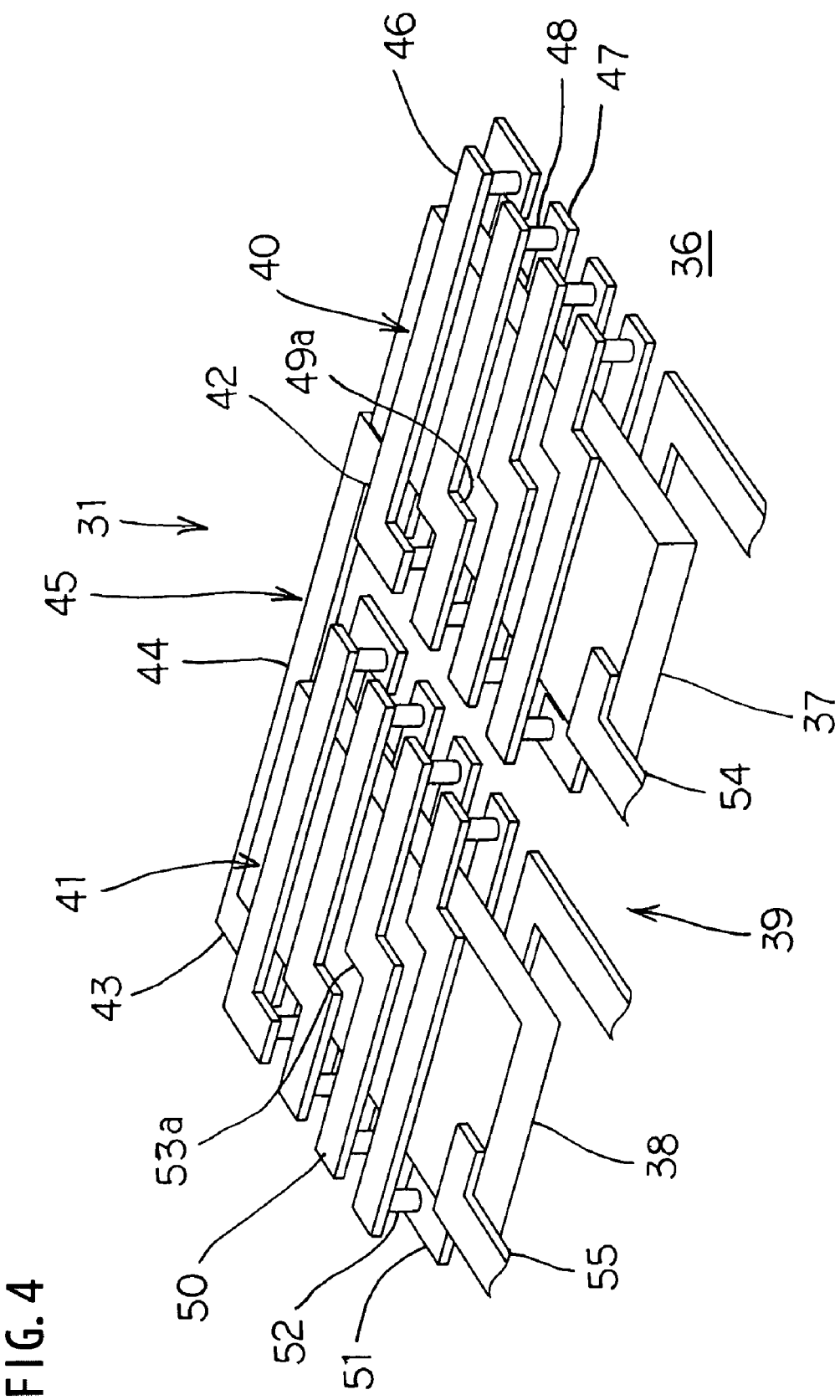
FIG. 4 is a perspective view showing a magnetic storage device according to a second embodiment.

More specifically, in a magnetic storage device 31 shown in FIGS. 4 and 5, similar to the magnetic storage device 1, on a surface of the same semiconductor substrate 36, a first ferromagnetic tunnel junction element 37 and a second ferromagnetic tunnel junction element 38 are formed adjacently to, and apart from each other in a direction perpendicular to a magnetization direction (anteroposterior direction in FIGS. 4 and 5) of the fixed magnetization layers 3 (refer to FIG. 1) of the first and second ferromagnetic tunnel junction elements 37, 38. In the magnetic storage device 31, the first ferromagnetic tunnel junction element 37 and the second ferromagnetic tunnel junction element 38 compose a storage element 39 of one bit, and on the same semiconductor substrate 36, the storage elements 39 of a plurality of bits are formed apart from each other in lateral and vertical directions. However, in order to facilitate understanding, the storage element 39 of one bit is focused on here for description.

The storage element 39, as shown in FIG. 4, a first coil-like writing lines 40 is formed around the first ferromagnetic tunnel junction element 37 and at the same time a second coil-like writing lines 41 is formed around the second ferromagnetic tunnel junction element 38, and a start-end portion 43 of the second writing lines 41 is connected to a terminal-end portion 42 of the first writing lines 40 via a joining portion 44 to form a sequence of writing lines 45, and further, a winding direction of the first writing wire 40 (clockwise in FIG. 4) and a winding direction of the second writing lines 41 (counterclockwise in FIG. 4) are reversed to each other.

A structure of the writing lines 45 is now described in detail. The first writing lines 40, as shown in FIGS. 4 and 5, is structured in such a manner that four pieces of upper writing lines 46 extending in the direction substantially perpendicular to the magnetization direction (downward direction in FIG. 5) of the fixed magnetization layer 3 of the first ferromagnetic tunnel junction element 37, above the first ferromagnetic tunnel junction element 37, and five pieces of lower writing lines 47 extending in the direction substantially perpendicular to the magnetization direction (downward direction in FIG. 5) of the fixed magnetization layer 3 of the first ferromagnetic tunnel junction element 37, below the first ferromagnetic tunnel junction element 37 are connected at right and left end edge portions of the upper writing lines 46 and the lower writing lines 47 via through-holes 48 to be wound around the first ferromagnetic tunnel junction element 37 clockwise like a coil, as shown in FIG. 4.

In addition, at an end portion or midway portions of the upper writing lines 46 at positions immediately above the first ferromagnetic tunnel junction element 37, the first writing lines 40 has parallel wiring portions 49a formed, which extend in a direction substantially parallel to the magnetization direction of the fixed magnetization layer 3.

Furthermore, at end portions or midway portions of the lower writing lines 47 at positions immediately below the first ferromagnetic tunnel junction element 37, the first writing lines 40 has parallel wiring portions 49b formed, which extend in the direction substantially parallel to the magnetization direction of the fixed magnetization layer 3.

The second writing lines 41, as shown in FIGS. 4 and 5, is structured in such a manner that four pieces of upper writing lines 50 extending in the direction substantially perpendicular to the magnetization direction (downward direction in FIG. 5) of the fixed magnetization layer 3 of the second ferromagnetic tunnel junction element 38, above the second ferromagnetic tunnel junction element 38, and five pieces of lower writing lines 51 extending in the direction substantially perpendicular to the magnetization direction (downward direction in FIG. 5) of the fixed magnetization layer 3 of the second ferromagnetic tunnel junction element 38, below the second ferromagnetic tunnel junction element 38 are connected at right and left end edge portions of the upper writing lines 50 and the lower writing lines 51 via through-holes 52 to be wound around the second ferromagnetic tunnel junction element 38 counter-clockwise like a coil, as shown in FIG. 4.

In addition, at an end portion or midway portions of the upper writing lines 50 at positions immediately above the second ferromagnetic tunnel junction element 38, the second writing lines 41 has parallel wiring portions 53a formed, which extend in the direction substantially parallel to the magnetization direction of the fixed magnetization layer 3.

Furthermore, at end portions or midway portions of the lower writing lines 51 at positions immediately below the second ferromagnetic tunnel junction element 38, the second writing lines 41 has parallel wiring portions 53b formed, which extend in the direction substantially parallel to the magnetization direction of the fixed magnetization layer 3.

A left end portion of the lower writing lines 47 that is the terminal-end portion 42 of the first writing lines 40 is connected to a left end portion of the lower writing lines 51 that is the start-end portion 43 of the second writing lines 41 via the joining portion 44. In the figures, reference numerals 54, 55 are reading wiring connected to the free magnetization layers 4 of the first and second ferromagnetic tunnel junction elements 37, 38.

In this manner, in the present embodiment, the parallel wiring portions 49a, 49b, 53a, 53b are formed in the upper writing lines 46, 50 and the lower writing lines 47, 51 of the first writing lines 40 and the second writing lines 41, respectively.

INDUSTRIAL APPLICABILITY

The present invention is carried out in the embodiments described above and brings about effects described below.

(1) In the present invention according to Claim 1, since a first coil-like writing lines is formed around a first ferromagnetic tunnel junction element and the same time a second coil-like writing lines is formed around a second ferromagnetic tunnel junction element, writing magnetic forces can be generated efficiently with a smaller writing current, thereby reducing power consumption in writing, so that lower power consumption of the magnetic storage device can be achieved.

In addition, since a winding direction of the first writing lines and a winding direction of a second writing lines are reversed to each other, magnetic fields generated when storage data contrary to each other is written in the first and second ferromagnetic tunnel junction elements form closed loops, so that a magnetic force for magnetizing a free magnetization layer of the first ferromagnetic tunnel junction element and a magnetic force for magnetizing a free magnetization layer of the second ferromagnetic tunnel junction element do not interfere with each other and thus the storage data can be written precisely in the first and second ferromagnetic tunnel junction elements and the reliability of the magnetic storage device can be improved.

(2) In the present invention according to Claim 2, since a start-end portion of the second writing lines is connected to a terminal-end portion of the first writing lines to form a sequence of writing lines, an occupying area of the writing lines can be reduced as much as possible, and thus the miniaturization of the magnetic storage device can be achieved.

(3) In the present invention according to Claim 3, since the first writing lines and the second writing lines have parallel wiring parts extending in a direction substantially parallel to a magnetization direction of fixed magnetization layers at positions immediately above or immediately below the first ferromagnetic tunnel junction element and the second ferromagnetic tunnel junction element, by an action of magnetic forces generated in the writing current flowing through the parallel wiring parts extending in the direction substantially parallel to the magnetization direction of the fixed magnetization layers, the direction of the writing magnetic forces acting on the free magnetization layers leans toward the magnetization direction of the fixed magnetization layers, which can produce an assist effect. Accordingly, the magnetization direction of the free magnetization layers can be changed smoothly with a smaller writing current and lower power consumption of the magnetic storage device can be achieved.

(4) In the present invention according to Claim 4, a structure of the first writing lines and the second writing lines is such that there are provided upper and lower writing lines extending in a direction substantially perpendicular to the magnetization direction of the fixed magnetization layers of the first ferromagnetic tunnel junction element and the second ferromagnetic tunnel junction element above and below the first ferromagnetic tunnel junction element and the second ferromagnetic tunnel junction element, and in addition that in at least one of the upper and lower writing lines, there are provided parallel wiring portions in the direction substantially parallel to the magnetization direction of the fixed magnetization layers at positions immediately above and immediately below the first ferromagnetic tunnel junction element and the second ferromagnetic element. Thus, by an action of the magnetic forces generated by the writing current flowing through the parallel wiring portions extending in the direction substantially parallel to the magnetization direction of the fixed magnetization layers, the direction of the writing magnetization forces acting on the free magnetization layers leans toward the magnetization direction of the fixed magnetization layers, which can produce an assist effect. Accordingly, the magnetization direction of the free magnetization layers can be changed smoothly with a smaller writing current and lower power consumption of the magnetic storage device can be achieved.

The invention claimed is:

1. A complementary type magnetic storage device to store contrary data in a first ferromagnetic tunnel junction element and a second ferromagnetic tunnel junction element, said magnetic storage device comprising:
    a semiconductor substrate with said first ferromagnetic tunnel junction element and said second ferromagnetic tunnel junction element formed adjacently thereon, each of said first and second ferromagnetic tunnel elements having a fixed magnetic layer and a variable magnetic layer;
    a first writing line wound around said first ferromagnetic tunnel junction element in a coil configuration that extends in a first direction; and
    a second writing line wound around said second ferromagnetic tunnel junction element in a coil configuration that extends in a second direction opposite to the first direction;
    wherein,
        said first writing line and said second writing line are wound reversed with respect to each other.

2. The magnetic storage device of claim 1, further comprising:
    a start-end portion of said second writing line connected to a terminal-end portion of said first writing line.

3. The magnetic storage device of claim 1, wherein:
    said first writing line and said second writing line have parallel wiring portions extending in a direction parallel to a magnetization direction of the fixed magnetization layers.

4. The magnetic storage device of claim 1, wherein:
    said first writing line and said second writing line have upper and lower writing lines extending in a direction perpendicular to a magnetization direction of said fixed magnetization layers of said first ferromagnetic tunnel junction element and said second ferromagnetic tunnel junction element; and
    at least one of said upper and lower writing lines comprises a parallel wiring portion extending in a direction parallel to the magnetization direction of said fixed magnetization layers.

5. The magnetic storage device of claim 2, wherein:
    said first writing line and said second writing line comprise parallel wiring portions extending in a direction parallel to a magnetization direction of the fixed magnetization layers.

6. The magnetic storage device of claim 2, wherein:
    said first writing line and said second writing line comprise upper and lower writing lines extending in a direction perpendicular to a magnetization direction of said fixed magnetization layers of said first ferromagnetic tunnel junction element and said second ferromagnetic tunnel junction element; and
    said upper and lower writing lines extend in a direction parallel to a magnetization direction of said fixed magnetization layers.

7. The magnetic storage device of claim 1, wherein first and second writing lines are connected together in series.

8. The magnetic storage device of claim 1 further comprising:
    a start-end portion of said first writing line adjacent to a front end of said first ferromagnetic tunnel junction element and a terminal-end portion of said first writing line adjacent to a back end of said first ferromagnetic tunnel junction element; and
    a start-end portion of said second writing line adjacent to a back end of said second ferromagnetic tunnel junction element and a terminal-end portion of said second writing line adjacent to a front end of said second ferromagnetic tunnel junction element.

9. The magnetic storage device of claim 8, wherein,
    said first writing line and second writing line are connected to each other such that a current enters and passes through said first writing line in a first direction relative to said ferromagnetic tunnel junction elements and said current enters and passes through said second writing line in second direction opposite to said first direction.

10. The magnetic storage device of claim 9, wherein,
said first direction is from said front end of said first ferromagnetic tunnel junction element to said back end of said first ferromagnetic tunnel junction element, and
said second direction is from said back end of said second ferromagnetic tunnel junction element to said front end of said second ferromagnetic tunnel junction element.

11. The magnetic storage device of claim 7, wherein said first writing line terminal-end portion is nearer said second writing line start-end portion than said second writing line terminal-end portion.

12. A magnetic storage device for storing data in configurations contrary to each other, said magnetic storage device comprising:
   a first ferromagnetic tunnel junction element and a second ferromagnetic tunnel junction element adjacently positioned on a semiconductor substrate and extending parallel to each other;
   a first writing line coiled around said first ferromagnetic tunnel junction element in a first direction; and
   a second writing line coiled around said second ferromagnetic tunnel junction element in a second direction that is opposite the first direction,
   wherein the first writing line and second writing line are connected to each other in series.

13. The magnetic storage device according to claim 12, wherein the first writing line generates a first magnetic force in a first magnetic force direction when storage data is written in the first ferromagnetic tunnel junction element is and the second writing line generates a second magnetic force in a second magnetic force direction different than the first magnetic force direction when storage data is written in the second ferromagnetic tunnel junction element.

14. The magnetic storage device according to claim 12, further comprising:
   a closed loop formed by the first ferromagnetic tunnel junction element and the second ferromagnetic tunnel junction element having a writing direction along the first writing line opposite to the writing direction along the second writing line.

* * * * *